United States Patent [19]
Brehmer

[11] Patent Number: 5,229,664
[45] Date of Patent: Jul. 20, 1993

[54] PROGRAMMABLE DIFFERENTIATOR DELAY

[75] Inventor: Kevin E. Brehmer, San Jose, Calif.

[73] Assignee: Exar Corporation, San Jose, Calif.

[21] Appl. No.: 725,864

[22] Filed: Jul. 3, 1991

[51] Int. Cl.$^5$ .................. H03B 1/00; H03K 5/00; H04B 1/10

[52] U.S. Cl. .................. 307/521; 328/167; 307/495

[58] Field of Search .............. 328/127, 167; 307/520, 307/521, 605, 608, 495; 330/294, 107, 109, 306

[56] References Cited

U.S. PATENT DOCUMENTS

| | | | |
|---|---|---|---|
| 3,701,059 | 10/1972 | Nyswander | 328/167 |
| 3,986,127 | 10/1976 | Ray | 328/128 |
| 4,039,862 | 8/1977 | Dingwall et al. | 307/279 |
| 4,438,406 | 3/1984 | McCormick et al. | 328/167 |
| 4,841,461 | 6/1989 | Yamamoto et al. | 328/167 |

FOREIGN PATENT DOCUMENTS

| | | |
|---|---|---|
| 0349664 | 7/1988 | European Pat. Off. |
| 0390977 | 12/1989 | European Pat. Off. |
| 0393633 | 4/1990 | European Pat. Off. |

OTHER PUBLICATIONS

"Selective RC Filter Based on MOS Transistors Having Direct Coupling", I. A. Belozerov, 1972 Consultants Burea, Plenum Pub., New York, pp. 1394–1396.

"High-Order Analog Filters Using Bipolar/JFET Technology", Tan et al., ISSCC 78/Wednesday, Feb. 15, 1978 Conference, Session VIII: Fully-Integrated Analog Filters.

"A 10.7 MHz Continuous-Time Bandpass Filter Bipolar IC", Koyama et al., Toshiba Corp., Japan, IEEE 1989 Custom Integrated Circuits Conference, pp. 25.2.1–25.2.4.

"An Input Stage Transconductance Reduction Technique for High-Slew Rate Operational Amplifiers", Schmoock, IEEE, vol. SC-10, No. 6, Dec. 1975, pp. 407–411.

"High-Frequency CMOS Continuous-Time Filters", Khorramabadi et al., IEEE, vol. SC-19, No. 6, Dec. 1984, pp. 939–948.

"2-10 MHz Programmable Continuous-Time 0.05° Equiripple Linear Phase Filter", Veirman et al., Silicon Systems, Inc., Tustin, Ca., IEEE 1991 Custom Integrated Circuits Conference, pp. 9.5.1–9.5.4.

"Bipolar Analog I.C. Design", Gilbert, Custom Integrated Circuits Conference, Ed. Sess. E2, May 23, 1985, pp. 82–83.

*Primary Examiner*—Timothy P. Callahan
*Attorney, Agent, or Firm*—Townsend and Towsend Khourie and Crew

[57] ABSTRACT

A programmable delay for the gate signal output of the differentiator in a data analyzing circuit is provided. A data signal is produced by a low pass filter, and a differentiator (high pass filter) produces a gate signal. The cutoff frequency of the low pass filter is controlled by a first control circuit, and a second control circuit is provided to separately control the cutoff frequency of the high pass filter. The second control circuit produces a variation from the base frequency determined by the first control circuit. Thus, the cutoff frequency of the high pass filter will always be proportional to that of the low pass filter.

16 Claims, 4 Drawing Sheets

PROGRAMMABLE DIFFERENTIATOR DELAY

BACKGROUND

The present invention relates to differentiators in disk drive read circuits for producing a gate signal to the qualifier comparator.

FIG. 1 shows a disk drive read circuit. A disk 110 is connected to a read/write amplifier 112. A signal is then provided through an automatic gain control circuit 114 in a pulse detector 115 to a filter and differentiator circuit 116. Filter/differentiator block 116 produces a qualified data signal and a gate signal. These are provided to a qualifier comparator circuit 118. The gate signal output provided to qualifier comparator 118 is produced by a differentiator in circuit 116. The cutoff frequency of this differentiator will determine the rise time of the gate signal, and thus the time at which the gate signal will become active. When the gate signal is received, the pulse detector 118 will compare the qualified data signal with a signal threshold level to determine whether the data is a digital zero or digital one. The result will then be passed on to a data separator circuit 120 which will then provide the output data for use by a computer or other device.

SUMMARY OF THE INVENTION

The present invention provides a programmable delay for the gate signal output of the differentiator in a data analyzing circuit. A data signal is produced by a low pass filter, and a differentiator (high pass filter) produces the gate signal. The cutoff frequency of the low pass filter is controlled by a first control circuit, and a second control circuit is provided to separately control the cutoff frequency of the high pass filter. The second control circuit produces a variation from the base frequency determined by the first control circuit. Thus, the cutoff frequency of the high pass filter will always be proportional to that of the low pass filter.

The second control circuit can be programmed to vary the cutoff frequency of a high pass filter from two to four times that of the low pass filter. Preferably, digital-to-analog converters (DACs) are used for the control circuits. The second DAC is preferably a multiplying current DAC.

The filters of the present invention are made from a unique BICMOS circuit which optimizes the advantages of bipolar and CMOS transistors. A differential amplifier pair uses unbalanced, or scaled, bipolar transistors. The load circuit is made of MOS transistors. A replica bias circuit uses both bipolar and MOS transistors and sets the bias conditions for the loads of the differential amplifier pair. The filter bandwidth is controlled by varying the amplifier bias current using the DACs discussed above. In one embodiment the circuit has an unbalanced emitter follower stage which drives the cross-coupled differential amplifier pair.

For further understanding of the nature and advantages of the present invention, reference should be made to the ensuing description taken in conjunction with the accompanying drawings.

DETAILED DESCRIPTION OF THE PREFERRED EMBODIMENT

Figure 1:
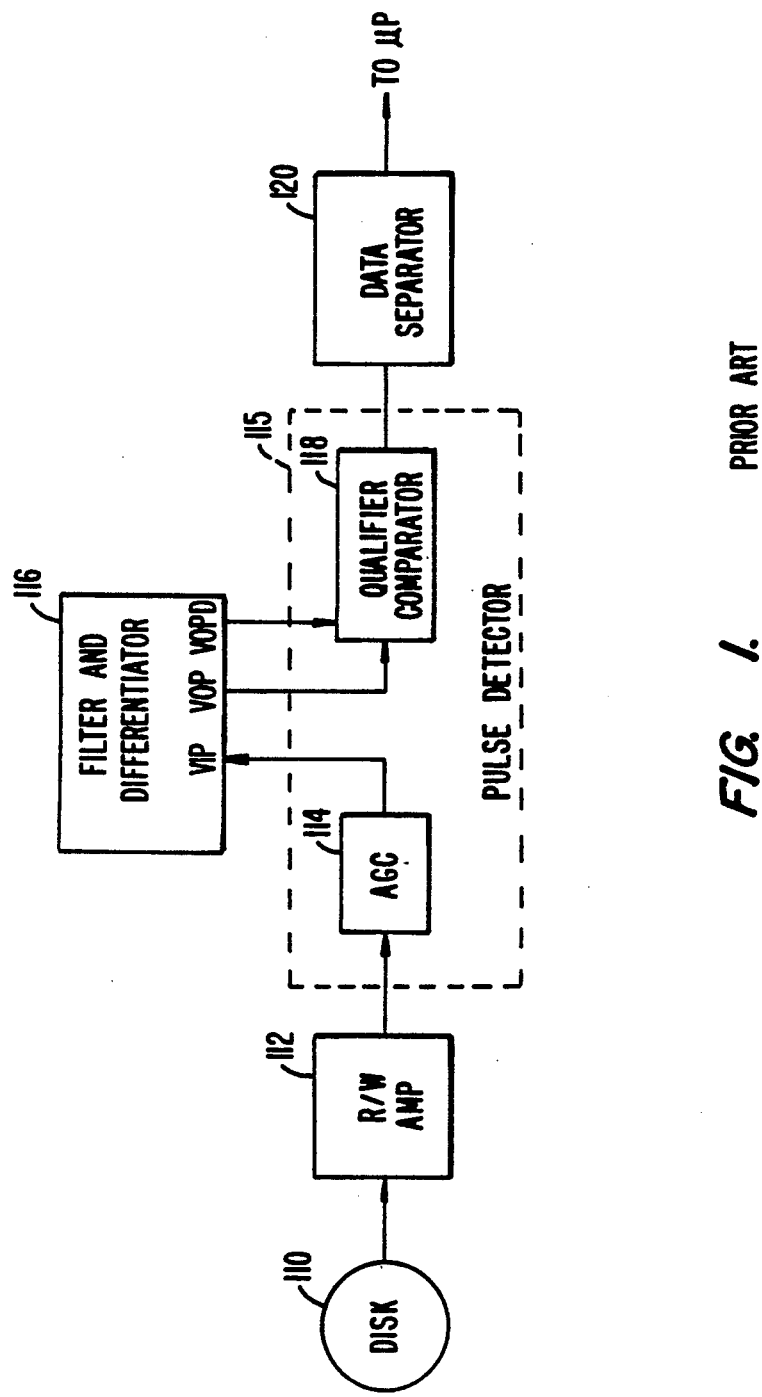
FIG. 1 is a block diagram of a prior art read circuit for a disk drive.
Figure 2:
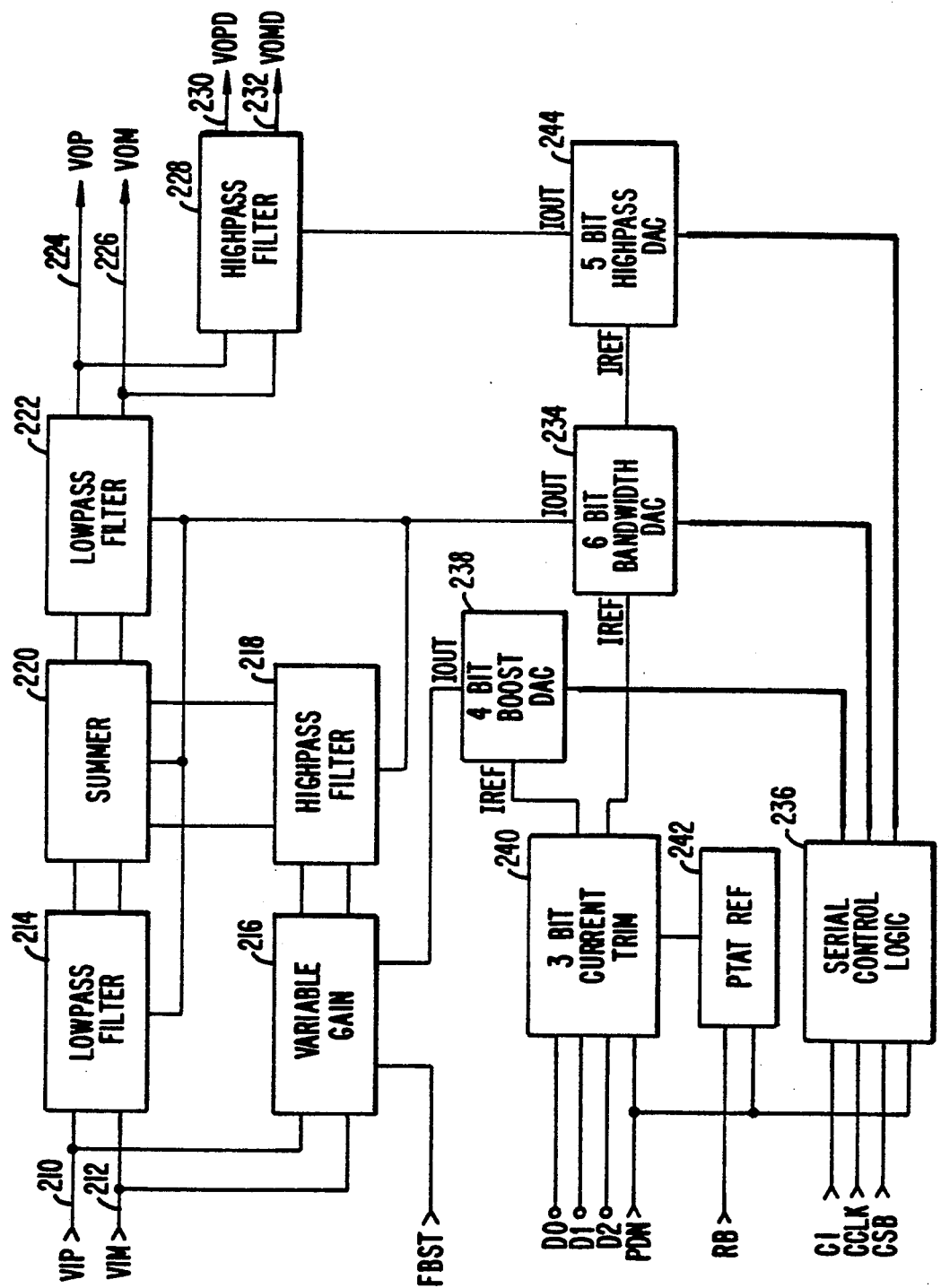
FIG. 2 is a block diagram of an improved low pass filter/differentiator circuit which can be substituted for circuit 116 of FIG. 1.

FIG. 2 is a block diagram of an improved filter/differentiator 116 of FIG. 1. Differential input lines 210 and 212 (VIP, VIM) provide the differential signal from the disk drive (through the read/write amplifier and AGC) to a low pass filter 214. The same signal is also provided through a variable gain amplifier 216 to a high pass filter 218. The outputs of high pass filter 218 and low pass filter 214 are combined in a summer 220 and provided to a second low pass filter 222.

The output of low pass filter 222 on lines 224 and 226 (VOP and VOM) is the differential qualified data signal. This signal is separately provided through a high pass filter 228 to provide the differential gate signal on lines 230, 232 (VOPD, VOMD).

The cutoff frequencies of low pass filters 214 and 222 is controlled by a DAC 234. DAC 234 is programmed with serial control logic 236. A separate DAC 238 controls the variable gain amplifier 216. Trim circuit 240 receives a control current which is Proportional To Absolute Temperature (PTAT) from a PTAT reference circuit 242. Current trim circuit 240 also provides the current reference value to DAC 234 and DAC 238.

A separate DAC provided by the present invention is DAC 244 which receives its reference current from DAC 234. It is separately programmable by logic 236 and provides a control signal to high pass filter 228. DAC 244 is programmable to provide its cutoff frequency at a value of two to four times the cutoff frequency controlled by DAC 234. Because DAC 244 receives its current reference from DAC 234, it will always provide a value proportional to that of DAC 234. The programmability of DAC 244 allows the delay between the filter outputs for the qualified data and gate signal to be varied to generate the optimum delay for the particular data being read. The outputs of DACs 234 and 244 control the reference current of the differential filters to which they are coupled. By implementing DAC 244 as a multiplying current DAC, the current it controls to high pass filter 228 will track that of the current provided by DAC 234.

Figure 3:
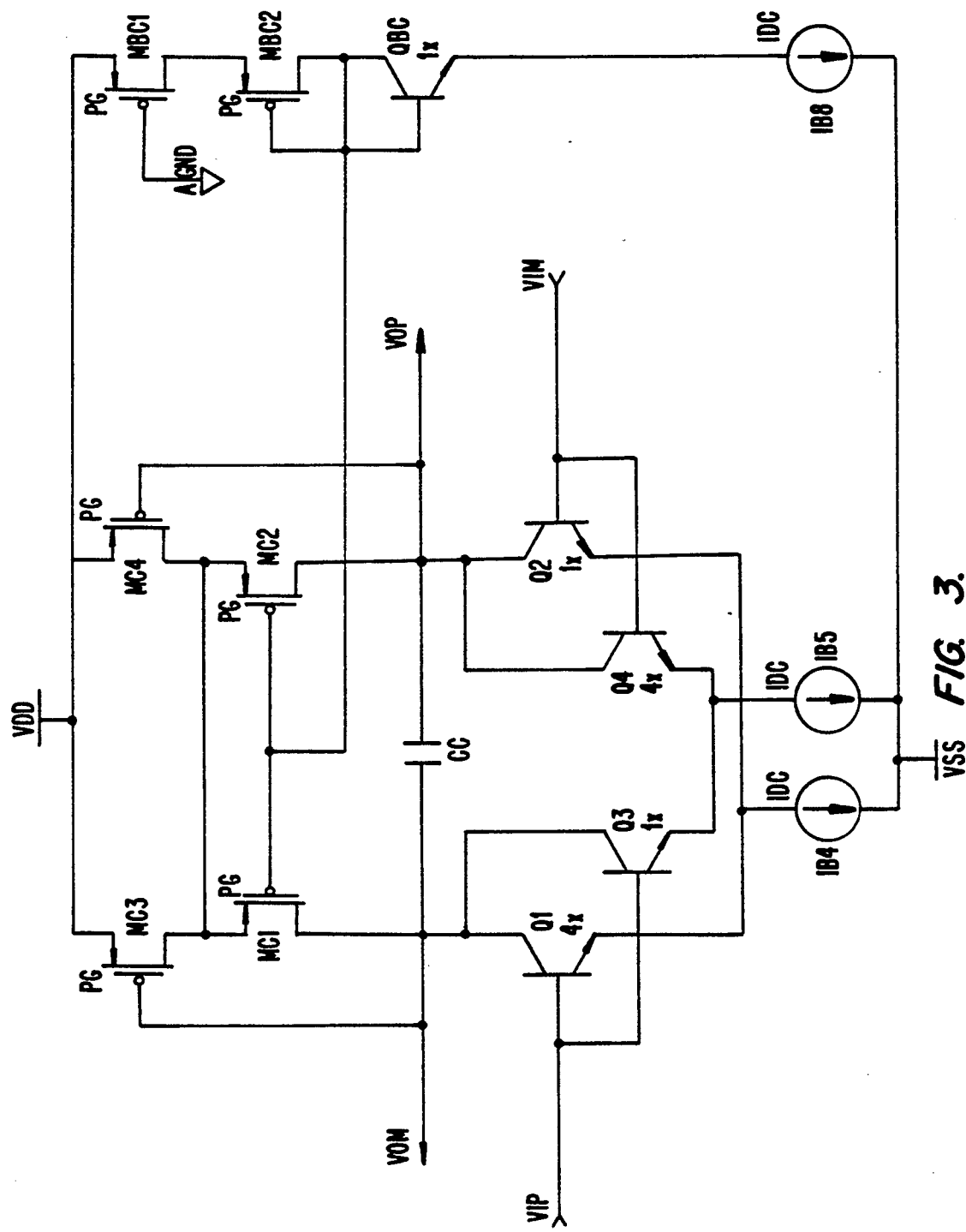
FIG. 3 is a circuit diagram of a BICMOS integrator for use as the transconductance element within the filters of FIG. 2.

FIG. 3 shows a circuit diagram for a differential integrator which can be used to implement any of low pass filters 214 and 222, and high pass filters 218 and 228 of FIG. 2. The current sources controlled by the DACs are IB4, IB5 and IB8 shown in the bottom of FIG. 3. FIG. 3 shows two differential pair transistors Q1, Q2, and Q3, Q4 connected to the current sources IB4 and IB5, respectively. Transistors Q1–Q4 are bipolar transistors which are chosen to provide fast response and linear transconductance control with variable bias current. The differential inputs to the circuit are VIP and VIM, and the outputs are VOP and VOM. These symbols were chosen to correspond to the inputs and outputs of the circuit of FIG. 2, although it should be understood that any particular filter in FIG. 2 might have an intermediate input or output. The differential transistors Q1–Q4 are scaled to provide a transconductance which is linear and remains linear as the current values of IB4 and IB5 are varied to program a cutoff frequency for the circuit.

A load circuit consisting of CMOS transistors MC1-MC4 is provided. CMOS transistors are chosen to take advantage of their small size and high impedance inputs to provide the appropriate loading of the differential pairs. A replica bias circuit consisting of CMOS transistors MBC1-2 and bipolar transistor QBC sets the bias conditions for the MC1-MC4 load circuit. This circuit will control the output DC common-mode voltage of the amplifier independent of temperature, power supply voltage and process variation. The choice of CMOS and bipolar transistors matches the corresponding elements in the load circuit and the differential amplifier.

The differential integrator can be implemented in any of the CMOS based BICMOS processes, including NWELL or PWELL CMOS, metal gate CMOS, single or double poly gate CMOS processes. The current sources IB2-IB8 can be implemented with either CMOS or bipolar transistors. For the present invention a NWELL CMOS based, BICMOS process is used in the implementation of a differential integrator design, with bipolar current sources, as shown in FIG. 3.

Figure 4:
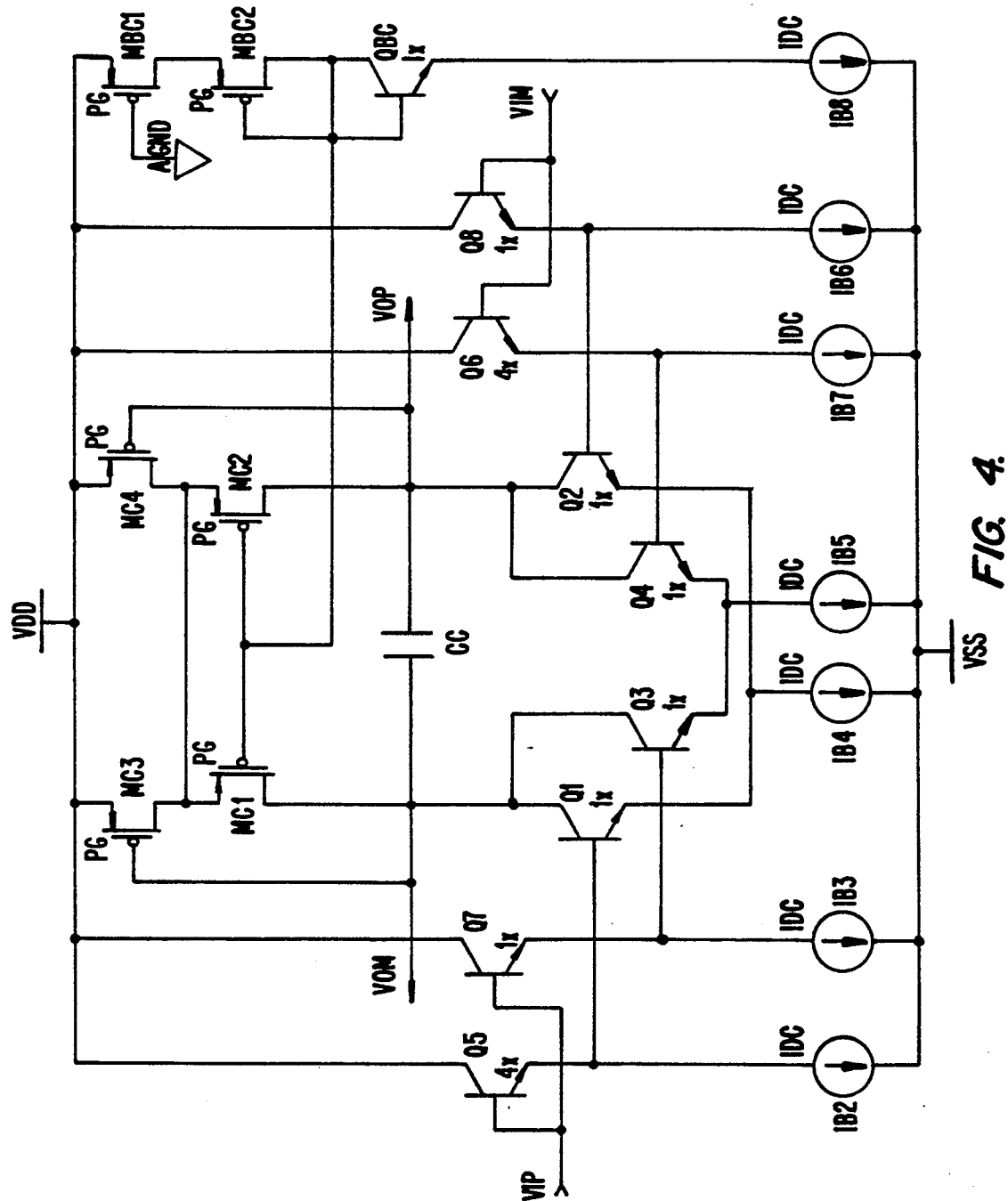
FIG. 4 is a circuit diagram of an alternate embodiment of the integrator of FIG. 3.

An alternate embodiment of that of FIG. 3 is shown in FIG. 4. The differential integrator is comprised of a highly linear transconductance (GM) amplifier and an integrating capacitor (CC). The transconductance amplifier is comprised of a pair of unbalanced level shifters (Q5, Q7), and (Q6, Q8) driving two differential input pairs (Q1, Q2) and (Q2, Q3) with corresponding current sources IB4 and IB5, respectively. The load circuit to the two differential pairs is common to both pairs and consists of transistors MC1-MC4.

The output common-mode voltage of the transconductance amplifier is determined by a replica bias technique. Transistors MBC1, MBC2 and QBC form the bias generation circuit, which is a replica of the load circuit for the two differential pairs. By keeping the current density of the bias circuit transistors MBC1 and MBC2 the same as the load circuit transistors MC1-MC2, MC3-MC4, respectively, the bias voltage applied to the gate of transistor MBC1 is reflected as the same voltage at the output to the transconductance amplifier.

During filter programming, the currents in the current sources within the transconductance amplifier are varied. To maximize the transconductance amplifier output voltage swing, the load impedance circuit must vary with current, such that the common mode output voltage remains constant. The proposed load circuit using replica biasing techniques produces this feature.

Linearization of the effective amplifier transconductance (GM) is accomplished by summation of the two unbalanced differential currents at the amplifier outputs, and is, therefore, a function of the scaled level shifter emitter areas for transistors Q5, Q6, Q7, and Q8. The linearization could have been achieved by scaling the input differential pair transistors instead of the level shifter transistors, as shown in FIG. 3. Scaling the level shifter transistors enables higher frequency operation of the transconductance amplifier. The effective transconductance is proportional to the scaled ratio of the level shifter transistor emitter area of transistors Q5 to Q7 and Q6 to Q8. For our case this ratio is 4:1, however, there is no limitation to this value.

The input referred noise and temperature variation is vastly improved. The input referred noise equation is as follows:

$$Veq^2/\Delta f = 4KT(0.64)(Rb + (1/2\ gm))$$

For the proposed circuit, the effective transconductance degeneration is achieved by the ratio of the scaled level shifter emitter areas and is therefore independent of temperature.

An integrator is comprised of a highly linear transconductance amplifier and a capacitor. The bandwidth of the integrator is determined by the ratio of the effective amplifier transconductance to the integration capacitor, as shown below.

Integrator Bandwidth $= GM/CC$

The proposed integrator is based on a differential input stage comprised of bipolar transistors, the programmability and temperature compensation of this integrator's bandwidth has many advantages. The effective transconductance of the amplifier is proportional to the DC operating collector current IC divided by the thermal voltage as shown below.

$$GM \propto IC/VT,$$

where
: $Vt = kT/q$
: k and q are constants

At a given temperature, Vt is constant and the integrator bandwidth is controlled by varying GM through bias current variation IC.

To achieve a constant integrator bandwidth over temperature, GM must remain constant over temperature. By developing a bias current that is proportional to temperature, the operating current Ic varies the same as the thermal voltage Vt, and therefore, GM will remain constant over temperature.

As will be understood by those familiar with the art, the present invention may be embodied in other specific forms without the departing from the spirit or essential characteristics thereof. Accordingly, the disclosure of the preferred embodiment of the invention is intended to be illustrative, but not limiting, of the scope of the invention which is set forth in the following claims.

What is claimed is:

1. An apparatus comprising:
   a low pass filter having an input for receiving an input signal, and an output for producing a data signal, and a control input for varying a cutoff frequency of said low pass filter;
   a high pass filter, having an input coupled to said low pass filter, an output for producing a gate signal for said data signal, and a control input for varying a cutoff frequency of said high pass filter;
   a first control circuit, having a reference input, a first control output, coupled to said control input of said low pass filter, for producing a first control signal proportional to a signal on said reference input for controlling said cutoff frequency of said low pass filter, and a reference output for producing a reference output signal proportional to said signal on said reference input; and
   a second control circuit, having an input coupled to said reference output of said first control circuit and an output coupled to said control input of said high pass filter, for producing a second control signal proportional to said reference output signal for controlling said cutoff frequency of said high pass filter to be a multiple of said cutoff frequency of said low pass filter.

2. The apparatus of claim 1 further comprising first and second programming means coupled to said first and second control circuits, respectively, for setting a value of said first and second control signals.

3. The apparatus of claim 1 wherein said first and second control circuits are digital to analog converters.

4. The apparatus of claim 3 wherein said second control circuit is a multiplying current digital to analog converter.

5. The apparatus of claim 2 wherein said second programming means has n digital programming input lines and said first programming means has greater than n digital programming input lines.

6. The apparatus of claim 1 wherein said input signal is a differential input signal and said high pass filter is a BICMOS circuit comprising:
 a differential bipolar amplifier having a plurality of transistors with scaled transistor sizes;
 a load impedance circuit of MOS transistors coupled to said differential amplifier; and
 a bias generating circuit having MOS and bipolar transistors coupled to said load impedance circuit.

7. The apparatus of claim 6 wherein said differential amplifier comprises:
 a first bipolar transistor having a base coupled to a first differential input and a collector coupled to a first differential output;
 a second bipolar transistor having a base and collector coupled to said base and collector of said first transistor, said first and second transistors having scaled sizes in a ratio of approximately four to one;
 a third bipolar transistor having a base coupled to a second differential input and a collector coupled to a second differential output;
 a fourth bipolar transistor having a base and collector coupled to said base and collector of said third transistor, said third and fourth transistors having scaled sizes in a ratio of approximately four to one;
 a first current source coupled to the emitters of said first and third transistors; and
 a second current source coupled to the emitters of said second and fourth transistors.

8. The apparatus of claim 7 wherein said output of said second control circuit is coupled to said first and second current sources to vary the current of said first and second current sources.

9. The apparatus of claim 7 wherein said load impedance circuit comprises:
 a first MOS transistor having its gate coupled to said first differential output and its source coupled to a supply voltage;
 a second MOS transistor having its gate coupled to sad second differential output, its source coupled to said supply voltage and its drain coupled to a drain of said first MOS transistor;
 a third MOS transistor having a source coupled to the drains of said first and second MOS transistor and a drain coupled to said first differential output; and
 a fourth MOS transistor having a source coupled to the drains of said first and second MOS transistors, a drain coupled to said second differential output, and a gate coupled to a gate of said third MOS transistor and said bias generating circuit.

10. The apparatus of claim 9 wherein said bias generating circuit comprises:
 a fifth MOS transistor having a source coupled to said supply voltage and a gate coupled to an analog ground;
 a sixth MOS transistor having a source coupled to a drain of said fifth MOS transistor and a drain coupled to said gates of said third and fourth MOS transistors; and
 a bipolar transistor having a collector coupled to the drain of said sixth MOS transistor and a base coupled to the gates of said third, fourth and sixth MOS transistors; and
 a third current source coupled to an emitter of said bipolar transistor.

11. An apparatus comprising:
 a low pass filter having an input for receiving an input signal and an output for producing a data signal and a control input for receiving a first control signal to vary a cutoff frequency of said low pass filter;
 a high pass filter, having an input coupled to said low pass filter, an output for producing a gate signal for said data signal, and a control input for receiving a second control signal to vary a cutoff frequency of said high pass filter;
 a first digital to analog converter, having a reference input, an output for providing said first control signal, responsive to a signal on said reference input, to said control input of said low pass filter, and a reference output for providing a reference output signal in response to said signal on said reference input; and
 a multiplying current digital to analog converter, having an input coupled to said reference output of said first digital to analog converter and an output coupled to said control input of said high pass filter, for providing said second control signal to control said cutoff frequency of said high pass filter to be a multiple of said cutoff frequency of said low pass filter.

12. A BICMOS transconductance amplifier comprising:
 a differential bipolar amplifier having a data input, a data output and a plurality of transistors with scaled transistor sizes;
 a load impedance circuit of MOS transistors coupled to said data output of said differential amplifier; and
 a bias generating circuit having MOS and bipolar transistors coupled to an input of said load impedance circuit.

13. The apparatus of claim 12 wherein said data input has a first differential input and a second differential input and said data output has a first differential output and a second differential output and said differential amplifier comprises:
 a first bipolar transistor having a base coupled to said first differential input and a collector coupled to said first differential output;
 a second bipolar transistor having a base and collector coupled to said base and collector of said first transistor, said first and second transistors having scaled sizes in a ratio of approximately four to one;
 a third bipolar transistor having a base coupled to said second differential input and a collector coupled to said second differential output;
 a fourth bipolar transistor having a base and collector coupled to said base and collector of said third transistor, said third and fourth transistors having scaled sizes in a ratio of approximately four to one;

a first current source coupled to the emitters of said first and third transistors; and a second current source coupled to the emitters of said second and fourth transistors.

14. The apparatus of claim 13 further comprising a control circuit coupled to said first and second current sources to vary the current of said first and second current sources.

15. The apparatus of claim 13 wherein said load impedance circuit comprises:

a first MOS transistor having its gate coupled to said first differential output and its source coupled to a supply voltage;

a second MOS transistor having its gate coupled to said second differential output, its source coupled to said supply voltage and its drain coupled to a drain of said first MOS transistor;

a third MOS transistor having a source coupled to the drains of said first and second MOS transistor and a drain coupled to said first differential output; and a fourth MOS transistor having a source coupled to the drains of said first and second MOS transistors, a drain coupled to said second differential output, and a gate coupled to a gate of said third MOS transistor and said bias generating circuit.

16. The apparatus of claim 15 wherein said bias generating circuit comprises:

a fifth MOS transistor having a source coupled to said supply voltage and a gate coupled to an analog ground;

a sixth MOS transistor having a source coupled to a drain of said fifth MOS transistor and a drain coupled to said gates of said third and fourth MOS transistors; and a bipolar transistor having a collector coupled to the drain of said sixth MOS transistor and a base coupled to the gates of said third, fourth and sixth MOS transistors; and a third current source coupled to an emitter of said bipolar transistor.

* * * * *